United States Patent [19]

Soerensen et al.

[11] Patent Number: 4,495,216
[45] Date of Patent: Jan. 22, 1985

[54] POWDER FOR USE IN DRY SENSITIZATION FOR ELECTROLESS PLATING

[75] Inventors: Gunnar Soerensen, Risskov; Leo G. Svendsen, Åarhus C, both of Denmark

[73] Assignee: A/S Neselco, Copenhagen, Denmark

[21] Appl. No.: 400,884

[22] Filed: Jul. 22, 1982

[30] Foreign Application Priority Data

Jul. 24, 1981 [DK] Denmark .............................. 3300/81

[51] Int. Cl.³ .......................... B05D 3/00; C08K 3/10; C23C 3/02
[52] U.S. Cl. .................................... 427/25; 106/1.11; 427/47; 427/195; 427/212; 427/304; 427/305; 427/306; 428/407; 523/204; 524/310; 524/317; 524/434
[58] Field of Search .................. 524/310, 317, 434; 106/1.11; 427/306, 305, 304, 25, 47, 195; 523/204; 428/407

[56] References Cited

U.S. PATENT DOCUMENTS

| | | | |
|---|---|---|---|
| 3,917,555 | 11/1975 | Worschech et al. | 524/310 |
| 3,983,263 | 9/1976 | Weiss et al. | 523/310 |
| 4,020,009 | 4/1977 | Gulla | 427/305 |
| 4,042,730 | 8/1977 | Cohen et al. | 427/305 |
| 4,053,659 | 11/1977 | Gebauer et al. | 524/180 |
| 4,115,334 | 9/1978 | Gerow | 524/310 |
| 4,116,924 | 9/1978 | Peabody | 524/270 |
| 4,181,759 | 1/1980 | Feldstein | 427/305 |
| 4,220,678 | 9/1980 | Feldstein | 427/305 |
| 4,287,253 | 9/1981 | Leech | 428/323 |

FOREIGN PATENT DOCUMENTS

| | | |
|---|---|---|
| 0049882 | 4/1982 | European Pat. Off. |
| 0059456 | 9/1982 | European Pat. Off. |
| 0071218 | 2/1983 | European Pat. Off. |
| 1539080 | 1/1979 | United Kingdom |

OTHER PUBLICATIONS

Derwent Abs., 96168 D/52, (11-1981).

*Primary Examiner*—Herbert J. Lilling
*Attorney, Agent, or Firm*—Oblon, Fisher, Spivak, McClelland & Maier

[57] ABSTRACT

A powdered composition for use in dry sensitization for electroless metal deposition. The composition contains a hydrophobic thermoplastic material having deposited on its surface a surfactant and a sensitizing tin compound.

10 Claims, No Drawings

POWDER FOR USE IN DRY SENSITIZATION FOR ELECTROLESS PLATING

The invention relates to a powder for use in dry sensitization for electroless metal deposition, containing a plastics material and sensitizing compound.

Metal deposition on insulating substrates, e.g. plastics, may be performed by evaporation in vacuum, application of conductive inks or paints and subsequent electrolytic metal deposition, and electroless metal deposition which may be followed by electrolytic metal deposition.

Electroless metal deposition has found wide useage in electrotechnics and in metallization of finished plastic articles. A disadvantage of several known procedures for electroless metal deposition has been that it has proved difficult to obtain a sufficient adhesion of the sensitizing and activating compounds on the surface to be metallized. In particular it has been a disadvantage in the so-called two-step process, in which a plastic surface is first sensitized in an aqueous solution of a $Sn+2$ compound, upon which the adhering tin seeds, through subsequent dipping in an activator, e.g. an acqueous solution of palladium chloride, precipitate small amounts of metal from a metallizing bath until the metallizing process runs autocatalytically.

In order to avoid these disadvantages U.S. Pat. No. 3,011,920 describes that said sensitizing and activation may be performed in a one-step process such that the substrate to be metallized is dipped into a colloidal suspension of chlorides of tin and palladium. It is furthermore described how adhesion of the precipitated (deposited) metal layer may be improved by etching of the substrate before the combined sensitization and activation. In the one-step process mentioned it is often advantageous to intersperse an accelerating bath before metallization which may remove surplus tin substances on the substrate surface. Apart from the extra accelerator process stage the consumption of palladium is a disadvantage which makes the process more expensive. Furthermore it has been difficult to stabilize the solution used. Thus U.S. Pat. No. 4,220,678 describes an activating suspension which does not contain noble metals. However in this case more unstable metallizing baths are required which entails disadvantages in production.

In recent patent literature one may find several examples of two-step processes in which the sensitizing and the activating processes are separated, e.g. U.S. Pat. No. 4,042,730.

A disadvantage of wet sensitizing of the surface of a substrate is that it is difficult to obtain a selective metallization in a prescribed pattern which is desirable, in particular in electronics.

In Danish patent application No. 1507/79 (note: several corresponding foreign numbers exist) there is described a procedure for dry sensitization of an insulating surface and a powder for use in the procedure. The powder is transferred by means of a xerographic process and the powder particles have—at least on their surface—deposited a sensitizing compound. It is a two-step process in which sensitization is dry and is followed by activation by dipping in an aqueous solution of a palladium compound. The process has been demonstrated to be performed selectively with great flexibility and with a good adhesion of metal to plastic, in that the sensitizing powder is melted down onto the surface of the substrate. It has been shown that sensitizing powders manufactured according to the procedure described in Danish application No. 1507/79 (see note above) display a high stability and that the consumption of palladium may be reduced without reduction in the adhesion of metal to plastic.

An advantage of dry sensitization for electroless plating lies in that it may be performed selectively in that the powder is sprinkled onto the surface of the substrate in a pattern or it may be transferred to it electrostatically or magnetostatically, in which latter case each powder particle has incorporated a magnetic particle.

It is wellknown that toner powders are given a number of additives, e.g. as described in Swiss Pat. No. 581.851. These may be added in order to obtain suitable triboelectric conditions, less wear on a photoconductive platen or drum. U.S. Pat. No. 4,139,483 describes the use of surfactants for controlling the individual particle's conditions of surface charge.

These toner powders as described in the patent literature are not suited as a substrate for a metallizing process when they are melted down, since their hydrophobic conditions do not enhance the contact between the dry-sensitized surface and the aqueous activator solution. It has furthermore shown itself to be unsatisfactory to use hydrophilic plastic substances, in that they are sensitive to changes in atmospheric moisture and give problems in the metallizing process itself since the surface solubility is so large that it influences metal deposition in an undesirable way. In Danish patent application No. 4277/80 (several foreign corresponding numbers exist) a powder is described for use with dry sensitization which contains a mixture of hydrophobic and hydrophilic plastics substances which are brought into an aqueous suspension which also contains the sensitizing compounds, whereupon the suspension is spray dried. Such a toner powder having a uniform particle size of a few microns is not very sensitive to humidity and may be metallized following melting down on the surface of a substrate. It has been shown that a fairly high proportion of sensitizing compound is required, e.g. 5–10 o/o w/w of $SnCl_2.2H_2O$ in relation to the total plastics amount. There is a further disadvantage in using this toner powder in electrostatic transfer in that the individual powder particle may have greatly varying contants of hydrophilic and hydrophobic substances which entails an uneven sensitization of the toner powder and hence the necessity of an overdose of sensitizing compounds.

It is an object of the invention to procure a powder of the kind described in the claims which is particularly well suited for sensitizing the surface of a substrate for electroless metal deposition and which consists of electrostatic or magnetostatic particles wich make them suited for developing latent electrostatic of magnetostatic images, whether they be present on a so-called master in a xerographic process or in another way, for instance by being directly present on the substrate to be metallized. This is obtained by means of a powder according to claim 1.

Claim 2 defines a powder utilizing an inexpensive and in practice suitable sensitizing compound.

Claim 3 defines a powder which displays good adherence.

Claim 4 defines a powder which is particularly suited for electroless metal deposition.

Claim 5 defines a powder which is suitable for use with magnetic fields.

Claim 6 defines a manner of manufacture of a powder according to the invention.

Claim 7 defines a particularly useful process for manufacture of a powder according to the invention.

Claim 8 defines an advantageous use of the powder according to the invention.

Claim 9 defines a use of the powder according to the invention for the development of an electrostatic charge pattern.

Claim 10 defines the use of the powder according to claim 5 for the development of a magnetic pattern.

The powder according to the invention will be described in detail in the following with reference to Examples and a discussion of known manufacture of powders, it being understood that the word 'toner' does not necessarily limit the use of the powder with electrostatic or magnetostatic processes. With sufficient insight into the technique of electroless metal deposition the powder according to the invention may be used for dry sensitization of the surface of a substrate which is to be metallized electrolessly or by means of a combination of this process and other processes which are known from e.g. the galvanic technology.

That which has made possible the manufacture of a metallizable toner powder and which has not been realized until now is that conventional toner powder for photocopying machines may be made metallizable according to the invention. A description of conventional toner powders as used in developing electrostatic or magnetostatic images may be found in British Pat. No. 1,321,651, German accepted publication No. 2,606,998, and Swiss Pat. No. 581,851 which apart from information on plastics substances used also indicate the use of certain additives. In manufacture of toner powders for photocopying machines it has been known that quarternary amine compounds may be added as 'charge control' agents but it has not been realized until now that a toner powder may be manufactured that upon melting down may be metallized with better results than those obtained acccording to Danish patent application No. 1507/79 (for note vide supra) and the process described therein.

The powder according to the invention is manufactured by suspending a 'jet-milled' plastics powder in a solution or a dispersion of a surfactant or 'wetting agent'. The amount of surfactant in relation to the amount of plastic material may be from 0.1 o/oo to 10 o/o (percent) but the requirements to the quality of metallization makes it expedient to reduce the amount of surfactant since the metal layer would otherwise show a tendency to peel off. A number of surfactants may be used, e.g. lauryl sulphate, mono and diglycerides, tertiary fatty amines, polyoxyethyl sorbitan acid esters and other products, e.g. Tergitol (tm, Union Carbide). In case the surfactant is not water soluble it may be dispersed by means of ultrasound.

The sensitizing compound, e.g. $SnCl_2.2H_2O$ is added while stirring briskly in a concentration from 0.1 o/o to 10 o/o with respect to the plastics powder, and while stirring briskly the pH is changed in order that the sensitizing compound is precipitated on each individual plastics particle in the dispersion, whereupon the suspension is dried, for instance by means of spray drying which has shown itself to be particularly advantageous.

By the sensitization as described the surprising effect is obtained that hydrophobic plastic substances may be made metallizable in consequence of the surfactant being present on the individual powder particles in sufficient amount to ensure good contact between the melted-down particles and the solution out of which the catalyzing seeds are to be reduced, e.g. $PdCl_2$. The surprising effect may be explained by the lipoid part of the surfactant attaching itself to the hydrophobic toner particles, while the hydrophilic part is available to improve the contact to a liquid, in order that a sufficient number of catalyzing seeds may be precipitated. It has been realized that a sensitizing spray drying process may be performed at a higher temperature that the melting point of the surfactant. In a spray drying at temperatures which are considerably lower that the said melting point a disadvantage may show itself in that the later wet processes leech some of the surfactant from the center of the powder particle, whereby the definition of the metallization is reduced (edge definition, in the case of the metallization of a pattern). To the person skilled in the art it will be possible to find a suitable surfactant, with due regard to the characteristic properties of the plastics material, and which will have a suitable adhesion to each individual powder particle.

Even though the said surfactant and sensitizing compound are only added in minute amounts it may still entail changes in the triboelectric conditions and this must be taken into account when constructing the developer for the electrostatic charge image.

A number of processes are known for the development by means of toner powders of electrostatic and magnetostatic images, a.o. the magnetic brush described in U.S. Pat. No. 2,874,063 where the toner powder particles are used with magnetic particles which may be covered by a plastic material in order that the toner powder particles are charged by means of tribo-electric effects. In recent times a toner particle which contains a magnetically conductive particle has been described, e.g. German accepted publication No. 2,606,998.

In the patent literature a large number of descriptions of toner powders and additives may be found. For instance German accepted publication No. 1,089,265 describes the addition of colloidal $SiO_2$ and in German published application No. 1,522,708 it is described that metal salts of fatty acids may improve toner powders in certain ways. Furthermore German accepted publication describes the addition of colloidal $SiO_2$ which has been treated with a silico-organic compound in order to give this toner powder good properties at high humidity, in that it is well known that the tribo-electric conditions are dependent on the humidity conditions.

The greater part of the plastics materials which are used as toner powders are characteristic in that they consist of hydrophobic plastics materials. Toner powders are also commonly thermoplastic. A number of toner materials and their conditions are described in U.S. Pat. No. 2,297,691. In U.S. Pat. No. 3,079,342 a copolymer is described in which the comonomers are styrene and a methacrylate. It has been demonstrated that toner powders using styrene have good contrast properties which is an advantage when a high definition is desired. A number of plastic materials are available commercially which are suitable for toner powders, e.g. Piccotoner 1200 or Piccotoner 1278 (trade marks Hercules, Inc.).

A powder according to the invention for use in dry sensitization for electroless metal deposition contains a hydrophobic plastics base material and a sensitizing compound to an amount of up to 10 o/o of the plastics material and is made by the plastics material being suspended in a liquid, whereupon the sensitizing compound is added and precipitated onto each plastic particle with subsequent drying, the sensitizing compound having a concentration with respect to the plastics material of 0.1 to 10 o/o and that there are furthermore surfactants with a concentration of 0.1 o/oo to 100 o/oo, which surfactants are of the kind that have a lipoid part attaching itself to the hydrophobic plastics particles and a hydrophilic part available for improving the contact to a liquid, the suspension of the plastics material being performed in a liquid which contains a solution or a dispersion of the said surfactants.

In order to describe the invention in greater detail the following examples will be given of manufacture and use of the powder according to the invention.

EXAMPLE 1

To an aqueous solution of 0.5 o/oo lauryl sulphate in 1000 ml distilled water 100 g Piccotoner 1200 (tm, Hercules Inc.) which has been ground on a trost (tm) jet-mill is added. Following vigorous stirring 500 ml of an aqueous solution of $SnCl_2.2H_2O$ is added, the amount of $SnCl_2.2H_2O$ being adjusted so that it is 2–10 o/o of the amount of Piccotoner 1200 (tm). While stirring vigorously ammonia water is added until a pH 9–10 is obtained. The plastics suspension thus sensitized is spray dried on a spray drier (model 'Minor' from NIRO atomizer, Denmark), the speed of the atomizer wheel being 20,000 to 35,000 rpm, and the input and output temperatures being 175 degrees centigrade and 90 degrees centigrade respectively. The toner powder thus sensitized may be spread onto the surface of an insulating substrate by electrostatic or electrophotographic techniques, in which latter case it is mixed with glass spheres or iron powder. It may now by means of electrophotographic procedures be transferred in suitable apparatus in order that the sensitized toner powder develops a latent electrostatic image on a photoconductive substrate, wherefrom it is transferred to the substrate or it may develop the charge pattern on the substrate itself. Following melting-down at a temperature of 145 degrees centigrade the substrate which has been sensitized in the manner described is activated in a $PdCl_2$ solution holding 1 gram/liter in a weak salt/acid medium. The palladium seeds precipitated thus are able to deposit metal by catalytic action, for instance Cu from a metal bath containing a metal salt a complex builder, a reducing agent, and possibly a number of additives, such as detergents and compounds which have a beneficial influence on the mechanical and electrical properties of the deposited metal layer. An example of metallization is given in example 4.

EXAMPLE 2

An aqueous dispersion of a surfactant which may be a mixture of glycerol mono- and di-stearate (Atmer 122 (tm, ICI-Atlas)) is made by dispersing via ultrasound 2 o/oo Atmer 122 with respect to the weight of the solution. Into this is stirred 100 g styrene acryl copolymer resin, Org-D-0021 (tm, Hercules, Inc.) which has been ground in an agate mortar and subsequently treated in a Trost (TM) jet-mill. 2 o/o of $SnCl_2.2H_2O$ (with respect to the amount of copolymer) in an aqueous solution is added while stirring vigorously. Still stirring vigorously pH is adjusted to 9–10. The plastic suspension thus sensitized is spray dried on a spray dryer (model 'Minor' from NIRO Atomizer, Denmark), the speed of the atomizer wheel being 20,000 to 35,000 rpm and the input and output temperatures being 160 degrees centigrade and 70 degrees centigrade respectively. In this way a sensitized toner powder is obtained which may be melted down on a suitable substrate at 140 degrees centigrade and subsequently activated for electroless metallization by dipping in a palladium chloride solution in an acid medium. The transfer of said toner powder may be performed by sprinkling through a silk screen printing mask having a suitable mesh. The toner powder may also be incorporated as one component in a two-component developer in a magnetic brush or other device for developing latent electrostatic images in a conventional apparatus for electrophotography, by which both electrostatic and magnetostatic devices for reproduction purposes should be understood.

EXAMPLE 3

An aqueous suspension is made which in 400 ml contains 100 g of styrene-acrylic copolymer, e.g Organic Development Resin 18 (trade name of Hercules, Inc.), to which is added a suitable surfactant, e.g. Span 60 (tm, ICI-Atlas) in a concentration of 3 o/oo with respect to the amount of polymer. 30 g magnetic iron oxide having a particle size of 500 nanometres and a suitable coagulant e.g. a quarternary ammonium salt, is added. Stirring vigorously a solution of a tin compound, e.g. $SnCl_2.2H_2O$ is added to 2–10 o/o of the amount of polymer. The pH of the solution is adjusted to 9–10, and the suspension is spray dried on a spray dryer (model 'Minor' from NIRO Atomizer, Denmark). The speed of the atomizer wheel is 20,000 to 35,000 rpm, and the input and output temperatures are 150 degrees centigrade and 60 degrees centigrade respectively. The toner powder thus sensitized which has incorporated magnetic particles is suitable as a one-component developer for developing electrostatic and magnetostatic images which may be subsequently metallized in a conventional electroless deposition process which is further described in example 4.

EXAMPLE 4

A sensitized powder as described in examples 1 to 3 is melted down at a suitable temperature in relation to the softening and spreading temperatures of the powder. Using Org-D-21 (tm, Hercules, Inc.) which contains 2 o/o $SnCl_2.2H_2O$ and 3 o/oo surfactant (Atmer 122 (tm)), a sensitized surface is obtained by melting down at 140 degrees centigrade. This may reduce the necessary catalyst seeds out of an acid solution of palladium chloride (1 g/liter $PdCl_2$, 10 milliliter HCl) onto the surface at a treatment time of 15 minutes. Rinsing in distilled water is performed for 10 minutes, and metallization is performed in a commercial electroless deposition bath for copper (Shipley 328 (tm)) at room temperature for 15 minutes. The metallization is checked by means of the Rutherford back-scattering technique which is well known to the person skilled in the art, and the thickness of the metal layer as a function of time is found to be,

| Metallizing time (minutes) | Metal layer thickness (Angstrom) |
|---|---|
| ½ | 180 |
| 1 | 250 |
| 2 | 340 |
| 5 | 800 |
| 15 | 1900 |

Hereafter the thickness may be further increased by conventional galvanic processes.

We claim:

1. A finely powdered, hydrophobic, thermoplastic material which is useful in the sensitizing of the surface of a substrate on which metal is to be electrolessly deposited, prepared by depositing from 0.1 to 10% by weight of a surfactant and from 0.1 to 10% by weight of a sensitizing tin compound on a thermoplastic powder, said percentages being based the weight of said thermoplastic powder, the powdered material obtained by said process upon melting down on a substrate resulting in a well defined metallization edge subsequent to electroless metallization.

2. The powder composition of claim 1, wherein said sensitizing tin compound is a tin compound in its +2 valence state.

3. The powder composition of claim 1 or 2, wherein said powdered thermoplastic material is a styrene acrylic copolymer resin, said sensitizing compound is a hydrolyzed tin compound and said surfactant is a mixture of glycerol monostearate and glycerol distearate.

4. The powder composition of claim 3, wherein said hydrolyzed tin compound determined as $SnCl_2.2H_2O$ constitutes 2 o/o w/w and the mixture of glycerol monostearate and glycerol distearate constitutes 3 o/oo w/w, both with respect to the amount of said thermoplastic material.

5. The powder composition of claim 1 or 2, wherein the powdered composition fully comprises a finely powdered magnetic material.

6. A method of manufacturing the powder composition of claim 1, comprising:

mixing a finely powdered, thermoplastic material or thermoplastic material prepared by emulsion polymerization into a solution or dispersion of 0.1 to 100 o/oo w/w surfactant with respect to said thermoplastic material;

adding from 0.1 to 10 o/oo of a sensitizing tin compound based on the amount of said thermoplastic material compound to said dispersion or solution;

depositing the sensitizing tin compound and surfactant on said thermoplastic particles after adjusting the acidity of said solution or dispersion; and subsequently drying the treated thermoplastic material obtained.

7. The method of claim 6, wherein said drying step is conducted by spray drying the treating thermoplastic material.

8. A method of dry sensitization of a substrate surface for electroless metal deposition, comprising:

defining all or a portion of an image on said substrate surface by means of the thermoplastic material of claim 1;

melting down the applied thermoplastic material; and electrolessly metallizing the substrate upon the activated, applied thermoplastic material.

9. The method of claim 8, wherein the thermoplastic material of claim 1 is applied to the surface of said substrate electrostatically under the influence of charges previously deposited on the substrate.

10. The method of claim 8, wherein said thermoplastic material of claim 1 is applied magnetostatically to the surface of said substrate under the influence of poles which have previously been built up on the substrate.

* * * * *